United States Patent
Ashida et al.

(10) Patent No.: US 10,718,730 B2
(45) Date of Patent: Jul. 21, 2020

(54) SENSOR DEVICE

(71) Applicant: SHARP KABUSHIKI KAISHA, Sakai, Osaka (JP)

(72) Inventors: Nobuyuki Ashida, Sakai (JP); Kunihiko Iizuka, Sakai (JP); Akira Saito, Sakai (JP); Takeshi Mitsunaka, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 34 days.

(21) Appl. No.: 16/073,628

(22) PCT Filed: Jan. 24, 2017

(86) PCT No.: PCT/JP2017/002349
§ 371 (c)(1),
(2) Date: Jul. 27, 2018

(87) PCT Pub. No.: WO2017/130962
PCT Pub. Date: Aug. 3, 2017

(65) Prior Publication Data
US 2019/0041348 A1 Feb. 7, 2019

(30) Foreign Application Priority Data

Jan. 29, 2016 (JP) ................. 2016-016558

(51) Int. Cl.
*G01R 27/26* (2006.01)
*G01N 27/22* (2006.01)

(52) U.S. Cl.
CPC ....... *G01N 27/221* (2013.01); *G01R 27/2623* (2013.01); *G01N 27/223* (2013.01)

(58) Field of Classification Search
CPC . G01R 27/2605; H03K 17/955; G01N 27/223
See application file for complete search history.

(56) References Cited

U.S. PATENT DOCUMENTS 5,652,382 A * 7/1997 Nakagawa ........... G01N 27/048
324/678
7,439,877 B1 * 10/2008 Jarvinen ................ B64D 15/20
340/581

(Continued)

FOREIGN PATENT DOCUMENTS

| JP | H08-005590 A | 1/1996 |
| JP | 2007-192622 A | 8/2007 |
| JP | 2009-036644 A | 2/2009 |

OTHER PUBLICATIONS

Chien Jun-Chau, M Anwar, Y Erh-Chia, LP Lee, AM Niknejad, "6.5/11/17.5/30-GHz high throughput interferometer-based reactance sensors using injection-locked oscillators and ping-pong nested chopping", VLSI Circuits Digest of Technical Papers, 2014 Symposium on, 1-2.

(Continued)

*Primary Examiner* — Alvaro E Fortich
(74) *Attorney, Agent, or Firm* — ScienBiziP, P.C.

(57) ABSTRACT

A change in an imaginary part of a complex dielectric constant of an inspection object containing moisture is detected as a change in an oscillation frequency. A sensor device includes an oscillation unit that is formed in a semiconductor integrated circuit and an oscillation frequency detection unit that detects an oscillation frequency of the oscillation unit. The oscillation unit has capacitors that are connected to an inspection object in series and changes the oscillation frequency in accordance with a complex dielectric constant of the inspection object.

4 Claims, 11 Drawing Sheets (56) References Cited

U.S. PATENT DOCUMENTS

| | | | |
|---|---|---|---|
| 2003/0002238 A1* | 1/2003 | Toyoda | G01N 27/225 |
| | | | 361/302 |
| 2003/0062908 A1* | 4/2003 | Venter | G01N 33/46 |
| | | | 324/661 |
| 2007/0186649 A1* | 8/2007 | Sudo | G01N 27/223 |
| | | | 73/335.04 |
| 2008/0012578 A1 | 1/2008 | Campbell | |
| 2014/0139241 A1* | 5/2014 | Sakai | G01N 27/223 |
| | | | 324/665 |
| 2014/0197851 A1* | 7/2014 | Astley | G01N 27/223 |
| | | | 324/660 |
| 2015/0109004 A1* | 4/2015 | Blaschke | G01N 33/49 |
| | | | 324/682 |

OTHER PUBLICATIONS

Jun-Chau Chien, Anwar, M., Erh-Chia Yeh, Lee, L.P., Niknejad, A.M., "A 6.5/17.5-GHz dual-channel interferometer-based capacitive Sensor in 65-nm CMOS for high-speed flow cytometry", Microwave Symposium (IMS), 2014 IEEE MTT-S International, 1-4.

H. Yada, M. Nagai, K. Tanaka, "Origin of the fast relaxation component of water and heavy water revealed by terahertz time-domain attenuated total reflection spectroscopy", Chemical Physics Letters, pp. 166-170, 2008.

T. Arikawa, M. Nagai, K. Tanaka, "Characterizing hydration state in solution using terahertz time-domain attenuated total reflection spectroscopy", Chemical Physics Letters, pp. 12-17, 2008.

* cited by examiner

L0: INDUCTOR
C0,C1,C2: CAPACITOR
R2: RESISTOR

L1, L2: INDUCTOR
C3: CAPACITOR
M1, M2: TRANSISTOR
VDD: POWER SOURCE VOLTAGE
R1: RESISTOR
105: SENSING ELECTRODE

SENSOR DEVICE

TECHNICAL FIELD

The present invention relates to a sensor device that detects a state of an inspection object containing moisture.

BACKGROUND ART

It is known that a hydration phenomenon as described below occurs depending on a solute in aqueous solution. In a case where the solute is an electrolyte like NaCl, a hydration phenomenon in which a water molecule is constrained by the solute occurs due to electrolytic dissociation of the solute to ion. In a case where the solute is a nonelectrolyte like sugar, a hydration phenomenon occurs through electrostatic force or hydrogen bonding that is caused by a deviation of polarities in solute molecules. A hydration phenomenon is also largely involved in activity of a macromolecule such as protein.

Figure 10:
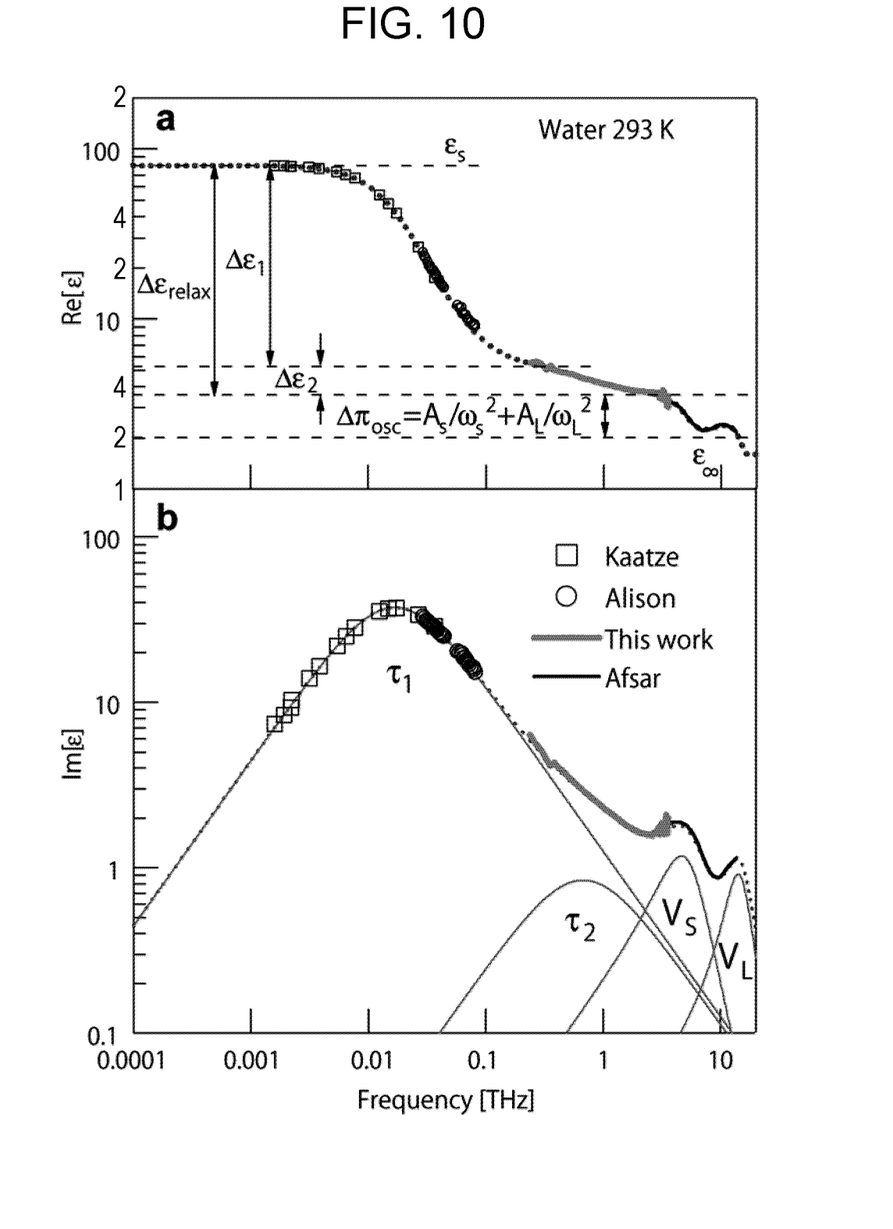
FIG. 10 is a graph illustrating a relation between a frequency by a conventional sensor device and an imaginary part or a real part of a complex dielectric constant of water.

In aqueous solution, when a water molecule is replaced with protein, bulk water (water in which a water molecule is sufficiently away from, a solute and not bound with protein) is reduced, so that a dielectric constant of the bulk water changes to a dielectric constant of the protein. In a complex dielectric constant of bulk water illustrated in FIG. 10 (FIG. 2 of NPL 3), in particular, an imaginary part of the complex dielectric constant largely varies in a frequency region particularly in a vicinity of 100 GHz due to a relaxation phenomenon of the bulk water. Since a main component of a living body is water, by checking not only a real part but also the imaginary part of the complex dielectric constant in a frequency region in a vicinity of 100 GHz, it is possible to check states of the living body and a biopolymer.

Figure 11:
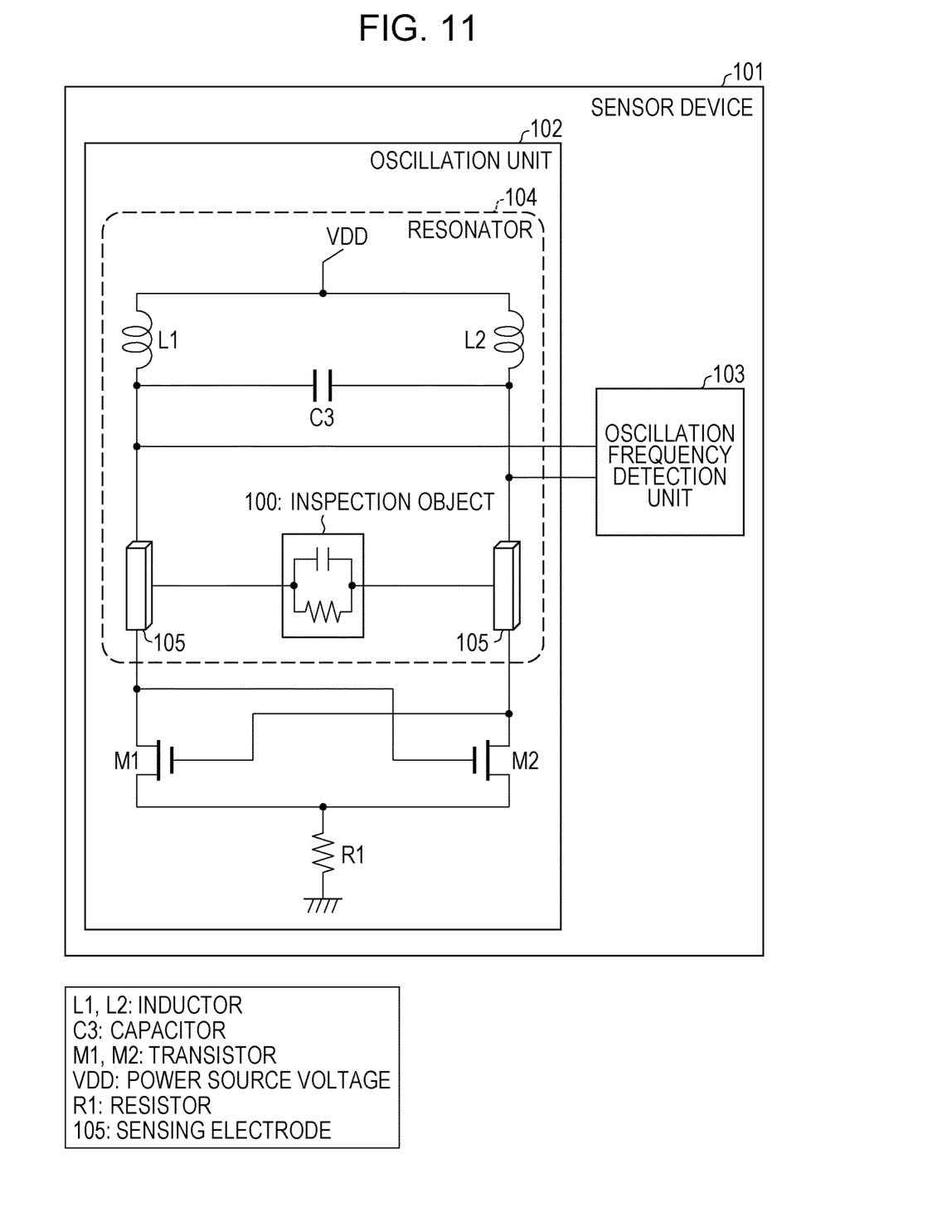
FIG. 11 is a block diagram illustrating a configuration of the conventional sensor device.

As a technique of detecting a change in a dielectric constant in a high frequency region, a sensor device 101 as illustrated in FIG. 11 is known as a related art (for example, NPLs 1 and 2). The sensor device 101 is formed on an integrated circuit and includes an oscillation unit 102 and an oscillation frequency detection unit 103. The oscillation unit 102 is constituted by a resistor R1, transistors M1 and M2 which are cross-coupled to each other, and a resonator 104. The resonator 104 is constituted by inductors L1 and L2, two sensing electrodes 105 that are made in contact with an inspection object 100, and a capacitor C3. A resonant frequency of the resonator 104 is 6 to 30 GHz.

Figure 12:
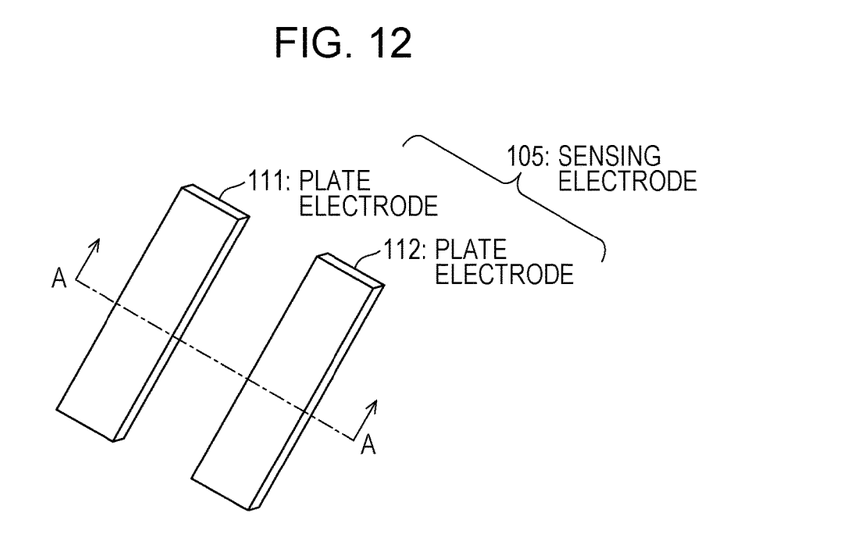
FIG. 12 is a perspective view illustrating structures of sensing electrodes in the sensor device illustrated in FIG. 11.
Figure 13:
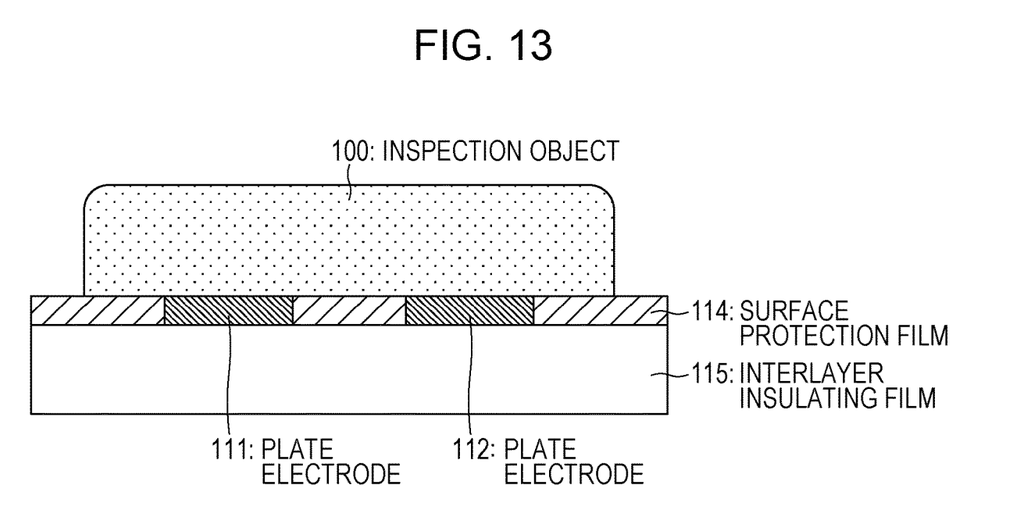
FIG. 13 is a sectional view illustrating a structure of a part of the sensor device illustrated in FIG. 11, which includes the sensing electrodes.

As illustrated in FIG. 12, the two sensing electrodes 105 are constituted by two plate electrodes 111 and 112 each of which has a rectangular shape. As illustrated in FIG. 13, the plate electrodes 111 and 112 are formed on an uppermost metal wiring layer of a semiconductor integrated circuit. FIG. 13 illustrates structures of the plate electrodes 111 and 112 in a cross section taken along a line A-A in FIG. 12 and viewed in the direction of the arrows. An interlayer insulating film 115 is disposed between metal wiring layers of the semiconductor integrated circuit. For convenience, FIG. 13 illustrates only the uppermost metal wiring layer and its lower interlayer insulating film 115. A surface protection film 114 covers a surface of the interlayer insulating film 115, but the surface protection film 114 does not cover regions thereof where the two plate electrodes 111 and 112 are disposed. Thus, exposed upper surfaces of the plate electrodes 111 and 112 directly contact the inspection object 100.

Next, an operation of the sensor device 101 will be described. In a case where a dielectric constant of the inspection object 100 that is near the sensing electrodes 105 changes, a parasitic capacitance value to the sensing electrodes 105 changes and the resonant frequency of the resonator 104 changes. A change in an oscillation frequency of the oscillation unit 102, which is associated with the change in the resonant frequency, is detected by the oscillation frequency detection unit 103. With the operation above, the sensor device 101 is able to detect the change in the dielectric constant, which is generated in the inspection object 100 near the sensing electrodes 105, as the change in the oscillation frequency.

CITATION LIST

Non Patent Literature

NPL 1: Chien Jun-Chau, M Anwar, Y Erh-Chia, L P Lee, A M Niknejad, "6,5/11/17,5/30-GHz high throughput interferometer-based reactance sensors using injection-locked oscillators and ping-pong nested chopping", VLSI Circuits Digest of Technical Papers, 2014 Symposium on, 1-2

NPL 2: Jun-Chau Chien, Anwar, M., Erh-Chia Yeh, Lee, L. P., Niknejad, A. M., "A 6.5/17.5-GHz dual-channel interferometer-based capacitive Sensor in 65-nm CMOS for high-speed flow cytometry", Microwave Symposium (IMS), 2014 IEEE MTT-S International, 1-4

NPL 3: H. Yada, M. Nagai, K. Tanaka, "Origin of the fast relaxation component of water and heavy water revealed by terahertz time-domain attenuated total reflection spectroscopy", Chemical Physics Letters, pp. 166-170, 2008

NPL 4: T. Arikawa, M. Nagai, K. Tanaka, "Characterizing hydration state in solution using terahertz time-domain attenuated total reflection spectroscopy", Chemical Physics Letters, pp. 12-17, 2008

SUMMARY OF INVENTION

Technical Problem

However, the sensor device 101 of the related art is able to detect a change in a real part of a complex dielectric constant, but is difficult to detect a change in an imaginary part of the complex dielectric constant. A maximum value of a frequency that is able to be detected by the sensor device 101 is 30 GHz. Thus, it is difficult for the sensor device 101 to detect, with sufficient sensitivity, a complex dielectric constant of the inspection object 100 containing moisture, in a frequency region in a vicinity of 100 GHz.

The invention is made in view of the aforementioned problems and an object thereof is to detect a change in an imaginary part of a complex dielectric constant of an inspection object.

Solution to Problem

In order to solve the aforementioned problems, a sensor device according to an aspect of the invention includes: an oscillation unit that is formed in a semiconductor integrated circuit; and an oscillation frequency detection unit that detects an oscillation frequency of the oscillation unit, in which the oscillation unit includes a capacitor connected to an inspection object in series and changes the oscillation frequency in accordance with a complex dielectric constant of the inspection object.

Advantageous Effects of Invention

According to an aspect of the invention, an effect that a change in an imaginary part of a complex dielectric constant of an inspection object is able to be detected as a change in an oscillation frequency is exerted.

DESCRIPTION OF EMBODIMENTS

Embodiment 1

Figure 1:
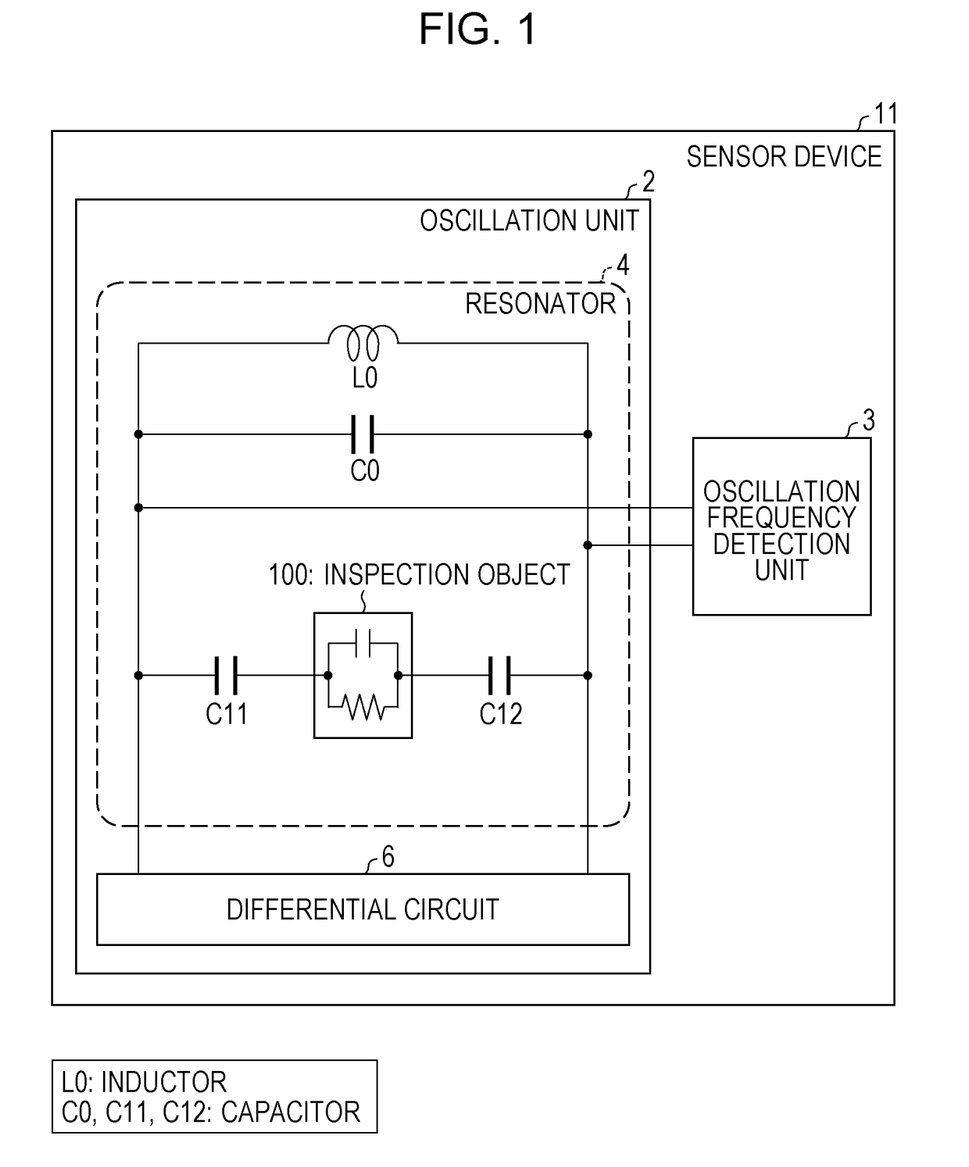
FIG. 1 is a block diagram illustrating a configuration of a sensor device according to Embodiment 1 of the invention.

Embodiment 1 of the invention will be described with reference to FIGS. 1 to 3.
(Configuration of Sensor Device 11)
FIG. 1 is a block diagram illustrating a configuration of a sensor device according to Embodiment 1 of the invention. As illustrated in FIG. 1, a sensor device 11 includes an oscillation unit 2 and an oscillation frequency detection unit 3.

The oscillation unit 2 is an LC oscillation circuit, which includes a differential circuit 6 and a resonator 4, and is formed as a part of a semiconductor integrated circuit on a semiconductor integrated circuit board which is not illustrated. An oscillation frequency of the oscillation unit 2 is preferably in a vicinity of 100 GHz, in particular, 30 to 200 GHz.

The resonator 4 has capacitors C0, C11, and C12 and an inductor L0. The inductor L0 and the capacitor C0 are connected in parallel. One end of the capacitor C11 is connected to one end of the inductor L0 and one end of the capacitor C0, and one end of the capacitor C12 is connected to the other end of the inductor L0 and the other end of the capacitor C0. An inspection object 100 contacts the other end of each of the capacitors C11 and C12. Thereby, the capacitors C11 and C12 are connected to the inspection object 100 in series. The resonator 4 has a resonant frequency that changes in accordance with a complex dielectric constant of the inspection object 100 and functions as a sensor unit that detects the complex dielectric constant. The capacitor C0 may be formed of a wire which is not illustrated or a parasitic capacitance of the differential circuit 6.

The oscillation frequency detection unit 3 is a part that detects the oscillation frequency of the oscillation unit 2 and a known frequency detection circuit is able to be used therefor. The oscillation frequency detection unit 3 may be formed on the semiconductor integrated circuit board or may not be formed on the semiconductor integrated circuit-board.

The differential circuit 6 is a circuit that includes a differential transistor pair and is appropriately formed by, for example, a known differential circuit such as a differential circuit that is constituted by a plurality of transistors cross-coupled to each other.
(Oscillation Frequency of Oscillation Unit 2)

Next, a relation between the complex dielectric constant of the inspection object 100 and the oscillation frequency of the oscillation unit 2 will be described. FIG. 2 is a circuit view illustrating an equivalent circuit of the resonator 4.

In a case where a capacitance that is detected when the inspection object 100 is air is $C^*\varepsilon_0$ and a complex relative dielectric constant of the inspection object 100 is $\varepsilon_r + j\omega\varepsilon_i$, a relation of a formula (1) is obtained.

[Mathematical formula 1]

$$C^*\varepsilon_0(\varepsilon_r + j\omega\varepsilon_i) = j\omega C^*\varepsilon_0(\varepsilon_r - j\varepsilon_i) \qquad (1)$$
$$= j\omega C^*\varepsilon_0\varepsilon_r + \omega C^*\varepsilon_0\varepsilon_i$$

Figure 2:
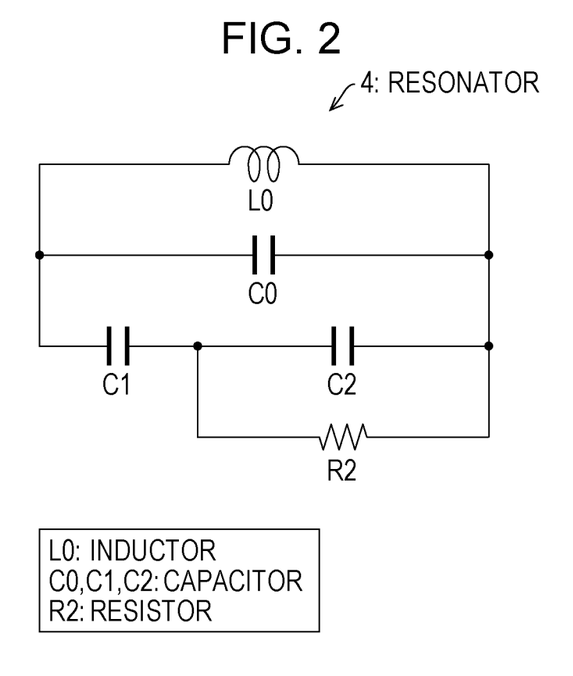
FIG. 2 is a circuit view illustrating an equivalent circuit of a resonator in the sensor device.

In a case where the inspection object 100 is represented by a parallel circuit of a capacitor C2 and a resistor R2 and a capacitance value of the capacitor C2 and a conductance value of the resistor R2 are respectively $C2 = C^*\varepsilon_0\varepsilon_r$ and $1/R2 = \omega C^*\varepsilon_0\varepsilon_i$, the resonator 4 is represented by the equivalent circuit illustrated in FIG. 2.

In FIG. 2, the capacitors C11 and C12 are combined into one as a capacitor C1 for ease of calculation. By considering a resonant condition, an oscillation frequency fres of the oscillation unit 2 is able to be represented as a formula (2).

[Mathematical formula 2]

$$fres = \frac{1}{2\pi\sqrt{L0C0}}\left(1 - \frac{C1C^*\varepsilon_0}{2C0} \frac{C1\varepsilon_r + C^*\varepsilon_0(\varepsilon_r^2 + \varepsilon_i^2)}{(C1 + C^*\varepsilon_0\varepsilon_r)^2 + (C^*\varepsilon_0\varepsilon_i)^2}\right) \qquad (2)$$

Figure 3:
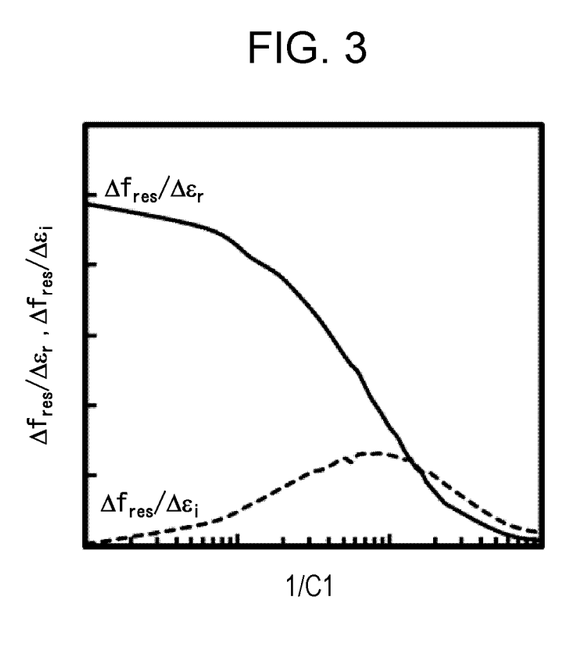
FIG. 3 is a graph illustrating a change rate of an oscillation frequency with respect to a change in a complex dielectric constant in capacitance values of capacitors connected to an inspection object in series in the sensor device.

FIG. 3 illustrates a result that a change rate ($\Delta$fres/$\Delta\varepsilon$) of the oscillation frequency with respect to a change in the complex dielectric constant in capacitance values of the capacitors C11 and C12 (capacitor C1) is calculated with use of the formula (2). Here, for convenience, C1 is treated as the capacitance value of the capacitor C1. In FIG. 3, a horizontal axis indicates a logarithm of an inverse of the capacitance value. In FIG. 3, the solid line indicates a change rate ($\Delta$fres/$\Delta\varepsilon_r$) of the oscillation frequency with respect to a change in a real part of the complex dielectric constant and the dotted line indicates a change rate ($\Delta$fres/$\Delta\varepsilon_i$) of the oscillation frequency with respect to a change in an imaginary part in the complex dielectric constant.

As C1 is smaller (as being closer to an open state in a high frequency region), $\Delta fres/\Delta\varepsilon_r$ is smaller than $\Delta fres/\Delta\varepsilon_r$ that is obtained when C1 is sufficiently large (in a short circuit state in the high frequency region). On the other hand, in the imaginary part of the complex dielectric constant, when C1 is sufficiently large, $\Delta fres/\Delta\varepsilon_i \approx 0$, and when C1 decreases, $\Delta fres/\Delta\varepsilon_i$ has a significant value and the change rate of the oscillation frequency reaches a maximum value when C1 has a certain value. Thus, C1 is set so that the change rate of the oscillation frequency is the maximum value or a value in a vicinity thereof.

(Operation of Sensor Device 11)

Next, an operation of the sensor device 11 will be described.

In a case where the complex dielectric constant of the inspection object 100 near the oscillation unit 2 changes, the resonant frequency of the resonator 4 changes. The oscillation frequency detection unit 3 detects a change in the oscillation frequency of the oscillation unit 2 due to the change in the resonant frequency. With the operation above, the sensor device 11 detects the change in the complex dielectric constant of the inspection object 100 near the oscillation unit 2 as the change in the oscillation frequency.

(Effect of Sensor Device 11)

An effect of the sensor device 11 in the present embodiment will be described.

The complex dielectric constant of the inspection object 100 containing moisture depends on a state of water that is a main component. Thus, the sensor device 11 is able to detect the state of the water in the inspection object 100 on the basis of the oscillation frequency of the oscillation unit 2. In particular, the capacitance values of the capacitors C11 and C12 that are connected to the inspection object 100 in series in the resonator 4 are set to values at which $\Delta fres/\Delta\varepsilon_i$ has almost a maximum value (the maximum value or a value in a vicinity of the maximum value). Thereby, the state of the water according to not only the real part of the complex dielectric constant but also the imaginary part of the complex dielectric constant is able to be detected. By detecting a change in the imaginary part of the complex dielectric constant of the water when the frequency is in a vicinity of 100 GHz, in particular, 30 to 200 GHz, a hydration state is able to be detected with sufficient sensitivity. Thus, states of a living body and a biopolymer are able to be known.

For example, as an amount of a target component in the inspection object 100 is large and there are more water molecules that are hydrated, the imaginary part of the complex dielectric constant of the inspection object 100 decreases. Thus, the sensor device 11 is able to detect a concentration of the target component of the inspection object 100 on the basis of the oscillation frequency of the oscillation unit 2.

For example, a healthy person has a glucose level in blood of 70 to 130 mg/dl. The glucose level significantly varies between a fasting state and a postprandial state in a day. When the glucose level is smaller than 70 mg/dl, there is possibility of hypoglycemia, and when the glucose level is larger than 130 mg/dl, there is possibility of diabetes. A concentration indicating the glucose level corresponds to order of mMol/L based on the number of mols. As a result of numerical calculation using a formula (4) of NPL 4, it is found that only an imaginary part of a dielectric constant of aqueous solution in which a solute is sugar changes when the concentration changes in the order of mMol/L. Thus, use of the sensor device 11 in which sensitivity for an imaginary part of a complex dielectric constant is improved makes it possible to measure a variation in the glucose level in blood.

For example, in a case where the inspection object 100 is a cell, since the cell is structured and has an imaginary part of a complex dielectric constant reduced as being aged, the sensor device 11 is able to determine whether the cell is young or old on the basis of the oscillation frequency of the oscillation unit 2.

In a case where the cell is cultured for regenerative medicine, when the cell is cultured on the sensor device 11, a state where the cell is grown through the culture is able to be monitored. It is also possible to monitor whether the grown cell survives thereafter or dies due to a certain factor. In a case where it is possible to detect that the cell has died, the cell as the inspection object 100 is discarded and cell culture is able to be performed again in a state where a condition is reset. In this manner, when the cell is cultured on the sensor device 11, efficiency of the cell culture is able to be greatly improved and efficiency of regenerative medicine or the like is able to be greatly improved.

Additionally, when the cell is placed on the sensor device 11 as the inspection object 100 or the cell is placed on an entire surface of the sensor device 11 as the inspection object 100 for the cell culture and the cell is stimulated by temperature, pH, a chemical solution, or the like, the cell activates. Thus, when distribution of water in the cell or a state of hydrogen bonding changes, the imaginary part of the complex dielectric constant of the cell mainly changes. Thereby, application to evaluation of efficacy and a side effect of a medicine in medicine and pharmacology is enabled.

Further, the oscillation unit 2 formed on the integrated circuit board is able to be formed roughly with an area of about 0.005 to 0.02 square millimeter when the frequency is 30 to 200 GHz. Therefore, a size of the sensor device 11 is able to be reduced. Moreover, a plurality of oscillation units 2 are able to be densely arranged. As a result, it is possible to detect states of a large number of inspection objects 100 at a time and detect a state of the inspection object 100 with a high spatial resolution.

On the other hand, in the sensor device 101 of the related art (refer to FIG. 11), the inspection object 100 and the oscillation unit 102 are directly connected by using the sensing electrodes 105. In a case where the formula (2) is applied to such a configuration, a pair of sensing electrodes 105 corresponds to the capacitors C11 and C12 (capacitor C1), so that C1=∞. In such a case, the oscillation frequency fres is represented by a formula (3) and thus does not depend on the imaginary part of the complex dielectric, constant. Accordingly, a change in the imaginary part of the complex dielectric constant is not able to be detected.

[Mathematical formula 3]

$$fres = \frac{1}{2\pi\sqrt{L0C0}}\left(1 - \frac{C1C^*\varepsilon_0\varepsilon_r}{2C0}\right) \quad (3)$$

Embodiment 2

Figure 4:
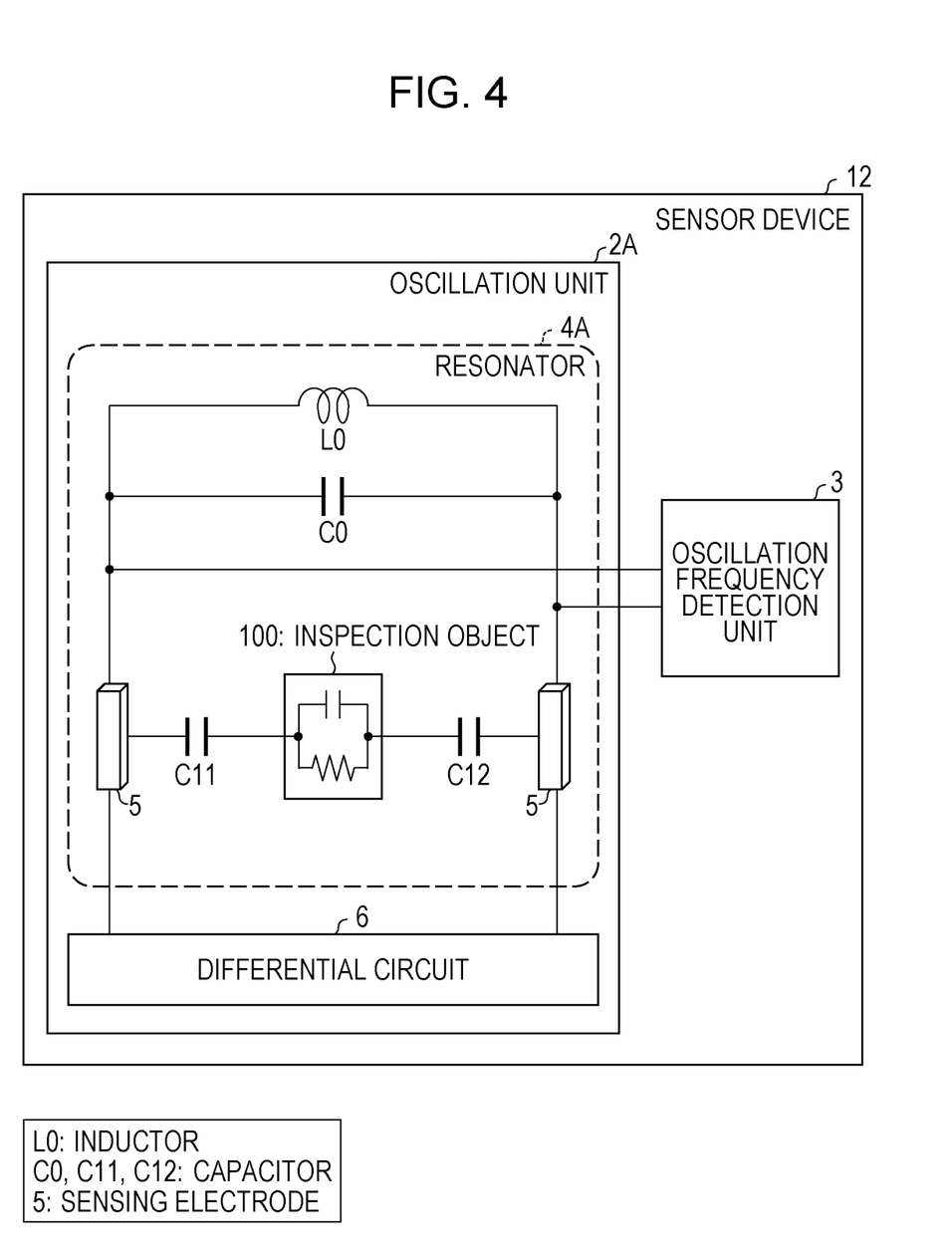
FIG. 4 is a block diagram illustrating a configuration of a sensor device according to Embodiment 2 of the invention.
Figure 5:
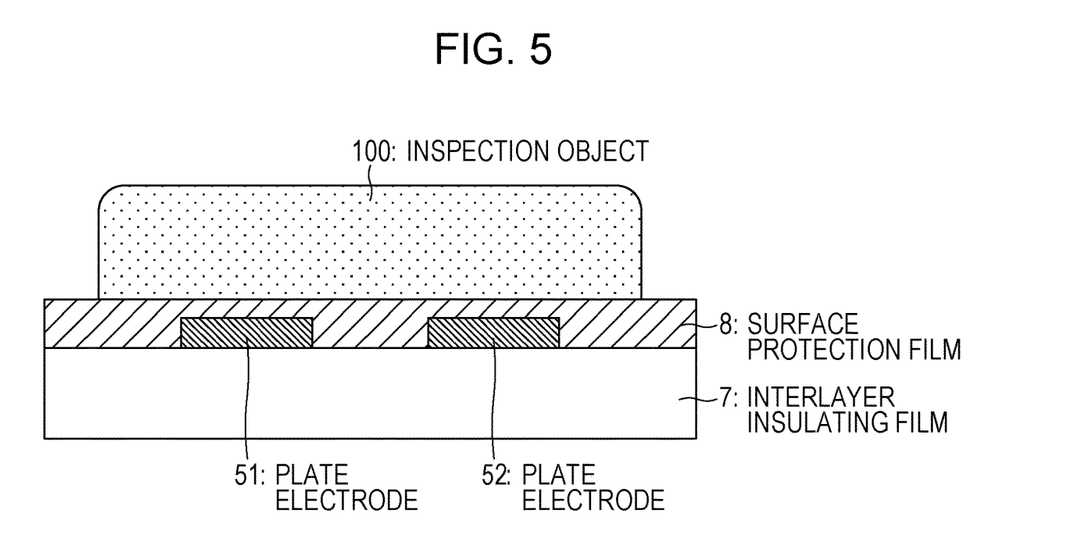
FIG. 5 is a sectional view illustrating a structure of a part of the sensor device illustrated in FIG. 4, which includes sensing electrodes.

Embodiment 2 of the invention will be described with reference to FIGS. 4 and 5. FIG. 4 is a block diagram illustrating a configuration of a sensor device 12 according to Embodiment 2. FIG. 5 is a sectional view illustrating a structure of a part of the sensor device 12, which includes the sensing electrodes 5. Note that, in the present embodiment, components having equivalent functions to those of the components of Embodiment 1 described above will be given the same numbers and description thereof will be omitted. (Configuration of Sensor Device 12)

As illustrated in FIG. 4, the sensor device 12 includes the oscillation frequency detection unit 3 similarly to the sensor device 11 described above, and includes an oscillation unit 2A instead of the oscillation unit 2 of the sensor device 11.

The oscillation unit 2A has the differential circuit 6 similarly to the oscillation unit 2, but is an LC oscillation circuit that has a resonator 4A instead of the resonator 4 of the oscillation unit 2 and is formed on the semiconductor integrated circuit board. An oscillation frequency of the oscillation unit 2A is preferably in a vicinity of 100 GHz, in particular, 30 to 200 GHz.

The resonator 4A has the capacitors C0, C11, and C12, and the inductor L0 similarly to the resonator 4 in the oscillation unit 2 described above. The resonator 4A has two sensing electrodes 5. One of the sensing electrodes 5 is connected to one end of the inductor L0 and one end of the capacitor C0, and the other of the sensing electrodes 5 is connected to the other end of the inductor L0 and the other end of the capacitor C0. Each of the sensing electrodes 5 is formed in a rectangular shape similarly to the sensing electrodes 105 (refer to FIG. 12) in the sensor device 101 of the related art described above.

A plurality of metal wiring layers are provided in the semiconductor integrated circuit, and an interlayer insulating film 7 illustrated in FIG. 5 is disposed between adjacent metal wiring layers. For convenience, FIG. 5 illustrates only the uppermost metal wiring layer and its lower interlayer insulating film 7. The two sensing electrodes 5 are constituted by two plate electrodes 51 and 52 that are formed by the uppermost metal wiring layer provided on the interlayer insulating film 7. An upper surface of the interlayer insulating film 7 and the uppermost metal wiring layer which includes the two plate electrodes 51 and 52 are covered with a surface protection film 8 of the semiconductor integrated circuit. The inspection object 100 contacts an upper surface of the surface protection film 8. In this state, in the surface protection film 8, a part between the plate electrode 51 and the inspection object 100 and a part between the plate electrode 52 and the inspection object 100 function as the capacitors C11 and C12. The capacitance values of the capacitors C11 and C12 formed by the surface protection film 8 in this manner are able to be controlled within a certain range in accordance with a shape of each of the sensing electrodes 5 and a thickness of the surface protection film 8.

(Oscillation Frequency of Oscillation Unit 2A)

The sensor device 12 of the present embodiment is different from the sensor device 11 of Embodiment 1 in that the capacitors C11 and C12 are formed by the surface protection film 8 of the semiconductor integrated circuit. The oscillation frequency of the oscillation unit 2A changes similarly to the change in the oscillation frequency of the oscillation unit 2 described in Embodiment 1. In the imaginary part of the complex dielectric constant, in a case where the capacitance values of the capacitors C11 and C12 are sufficiently large, $\Delta fres/\Delta \varepsilon_i \approx 0$, and in a case where the capacitance values decrease, $\Delta fres/\Delta \varepsilon_i$ has a significant value and reaches a maximum value of $\Delta fres/\Delta \varepsilon_i$ when the capacitance values have certain values.

(Operation of Sensor Device 12)

An operation of the sensor device 12 is the same as the operation of the sensor device 11 of Embodiment 1 and a change in the complex dielectric constant of the inspection object 100 near the oscillation unit 2A is detected as a change in the oscillation frequency.

In the resonator 4A, the sensing electrodes 5 face (indirectly contact) the inspection object 100 through the capacitors C11 and C12 that are formed by the surface protection film 8 of the semiconductor. Thereby, the resonant frequency changes in accordance with the complex dielectric constant of the inspection object 100.

(Effect of Sensor Device 12)

An effect of the sensor device 12 in the present embodiment will be described.

Similarly to the sensor device 11 in Embodiment 1, the sensor device 12 is able to detect a state of the water according to not only the real part of the complex dielectric constant but also the imaginary part of the complex dielectric constant. Thereby, by detecting a change in the imaginary part of the complex dielectric constant of the water when the frequency is in a vicinity of 100 GHz, in particular, 30 to 200 GHz, a hydration state is able to be detected with sufficient sensitivity.

In the sensor device 12, the capacitors C11 and C12 that are connected to the inspection object 100 in series are formed by using the surface protection film 8 of the semiconductor integrated circuit. This makes it possible to suppress an increase in a size and manufacturing cost of the sensor device 12.

Embodiment 3

Figure 6:
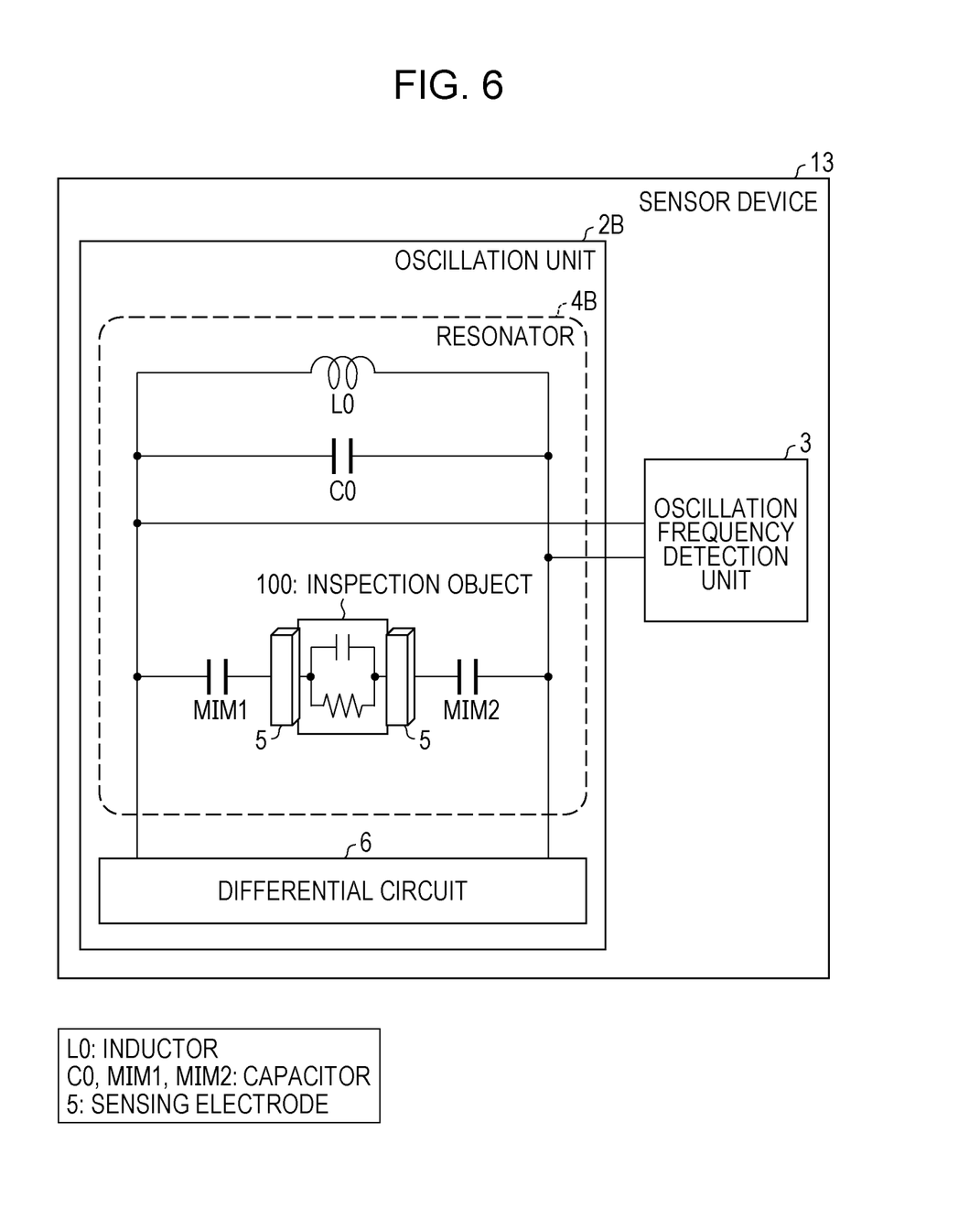
FIG. 6 is a block diagram illustrating a configuration of a sensor device according to Embodiment 3 of the invention.
Figure 7:
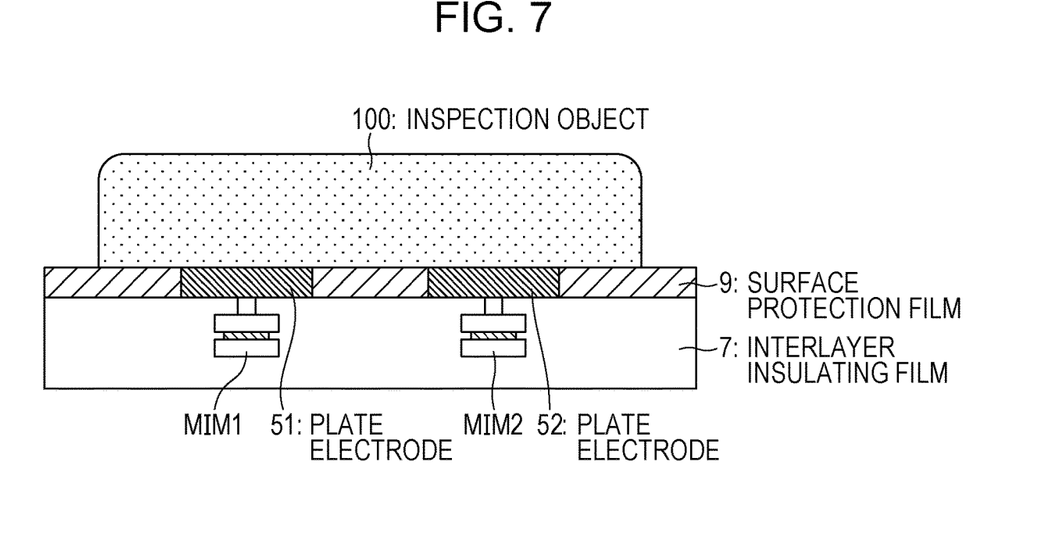
FIG. 7 is a sectional view illustrating a structure of a part of the sensor device illustrated in FIG. 6, which includes the sensing electrodes.

Embodiment 3 of the invention will be described with reference to FIGS. 6 and 7. FIG. 6 is a block diagram illustrating a configuration of a sensor device 13 according to Embodiment 3 of the invention. FIG. 7 is a sectional view illustrating a structure of a part of the sensor device 13, which includes the sensing electrodes 5. Note that, in the present embodiment, components having equivalent functions to those of the components of Embodiments 1 and 2 described above will be given the same numbers and description thereof will be omitted.

(Configuration of Sensor Device 13)

As illustrated in FIG. 6, the sensor device 13 includes the oscillation frequency detection unit 3 similarly to the aforementioned sensor device 12 of Embodiment 2, and includes an oscillation unit 2B instead of the oscillation unit 2A of the sensor device 12.

The oscillation unit 2B has the differential circuit 6 similarly to the oscillation unit 2A, but is an LC oscillation circuit that has a resonator 4B instead of the resonator 4A of the oscillation unit 2A and is formed on the semiconductor integrated circuit board. An oscillation frequency of the oscillation unit 2B is preferably in a vicinity of 100 GHz, in particular, 30 to 200 GHz.

Similarly to the resonator 4A in the oscillation unit 2A described above, the resonator 4B has the capacitor C0, the inductor L0, and two sensing electrodes 5. The resonator 4B has MIM (Metal-Insulator-Metal) capacitors MIM1 and MIM2 (capacitor elements). One end of the MIM capacitor MIM1 is connected to one end of the inductor L0 and one end of the capacitor C0, and one end of the MIM capacitor MIM2 is connected to the other end of the inductor L0 and the other end of the capacitor C0. One of the sensing electrodes 5 is connected to the other end of the MIM capacitor MIM1 and the other of the sensing electrodes 5 is connected to the other end of the MIM capacitor MIM2. The two sensing electrodes 5 contact the inspection object 100.

A plurality of metal wiring layers are provided in the semiconductor integrated circuit, and the interlayer insulating film 7 illustrated in FIG. 7 is disposed between adjacent metal wiring layers. For convenience, FIG. 7 illustrates only the uppermost metal wiring layer and its lower interlayer insulating film 7. The sensing electrodes 5 are constituted by two plate electrodes 51 and 52 that are formed by the uppermost metal wiring layer provided on the interlayer insulating film 7. The MIM capacitors MIM1 and MIM2 are respectively provided below the plate electrodes 51 and 52 in the interlayer insulating film 7. The MIM capacitors MIM1 and MIM2 are not necessarily required to be located below the plate electrodes 51 and 52. An upper surface of the interlayer insulating film 7 is covered with a surface protection film 9 of the semiconductor integrated circuit, except for the two plate electrodes 51 and 52. The inspection object 100 directly contacts the plate electrodes 51 and 52 and an upper surface of the surface protection film 9.

(Oscillation Frequency of Oscillation Unit 2B)

The sensor device 13 of the present embodiment is different from the sensor device 11 of Embodiment 1. The difference lies in that the sensor device 13 uses, as capacitors that contact the inspection object 100, the MIM capacitors MIM1 and MIM2 formed in the semiconductor integrated circuit, instead of the capacitors C11 and C12. The oscillation frequency of the oscillation unit 2B changes similarly to the change in the oscillation frequency of the oscillation unit 2 described in Embodiment 1. In the imaginary part of the complex dielectric constant, in a case where the capacitance values of the MIM capacitors MIM1 and MIM2 are sufficiently large, $\Delta fres/\Delta \varepsilon_i \approx 0$, and in a case where the capacitance values decrease, $\Delta fres/\Delta \varepsilon_i$ has a significant value and reaches a maximum value of $\Delta fres/\Delta \varepsilon_i$ when the capacitance values have certain values.

(Operation of Sensor Device 13)

An operation of the sensor device 13 is the same as the operation of the sensor device 11 of Embodiment 1 and a change in the complex dielectric constant of the inspection object 100 near the oscillation unit 2B is detected as a change in the oscillation frequency.

In the resonator 4B, the sensing electrodes 5 that are connected to the MIM capacitors MIM1 and MIM2 contact the inspection object 100. Thereby, the resonant frequency changes in accordance with the complex dielectric constant of the inspection object 100.

(Effect of Sensor Device 13)

An effect of the sensor device 13 in the present embodiment will be described.

Similarly to the sensor device 11 in Embodiment 1, the sensor device 13 is able to detect a state of the water-according to not only the real part of the complex dielectric constant but also the imaginary part of the complex dielectric constant. Thereby, by detecting a change in the imaginary part of the complex dielectric constant of the water when the frequency is in a vicinity of 100 GHz, in particular, 30 to 200 GHz, a hydration state is able to be detected with sufficient sensitivity.

In the sensor device 13, series capacitors connected to the inspection object 100 in series are realized by using the MIM capacitors MIM1 and MIM2 of the semiconductor integrated circuit. This makes it possible to suppress an increase in a size and manufacturing cost of the sensor device 13.

Further, the MIM capacitors MIM1 and MIM2 are able to be formed on the integrated circuit board separately from the sensing electrodes 5. Thus, a shape of each of the sensing electrodes 5 according to a shape of the inspection object 100 and the capacitance values of the capacitors to obtain desired $\Delta fres/\Delta \varepsilon$ are able to be set individually. Thus, the shape of the sensing electrode 5 and detection sensitivity are able to be achieved in a well-balanced manner.

Note that, though description has been given in the present embodiment for use of the MIM capacitors MIM1 and MIM2 as capacitor elements (series capacitors) connected to the inspection object 100 in series, the capacitor elements are not limited to the MIM capacitors MIM1 and MIM2. For example, capacitive elements formed on another integrated circuit, such as a MOM capacitor that has a structure in which an interlayer insulating film is held between two metal wiring layers and a MOS capacitor, may be used as the capacitor elements. Also in a case where the capacitor elements are constituted by such capacitive elements, a similar effect to the case where the MIM capacitors MIM1 and MIM2 are used as the capacitor elements is obtained.

Embodiment 4

Figure 8:
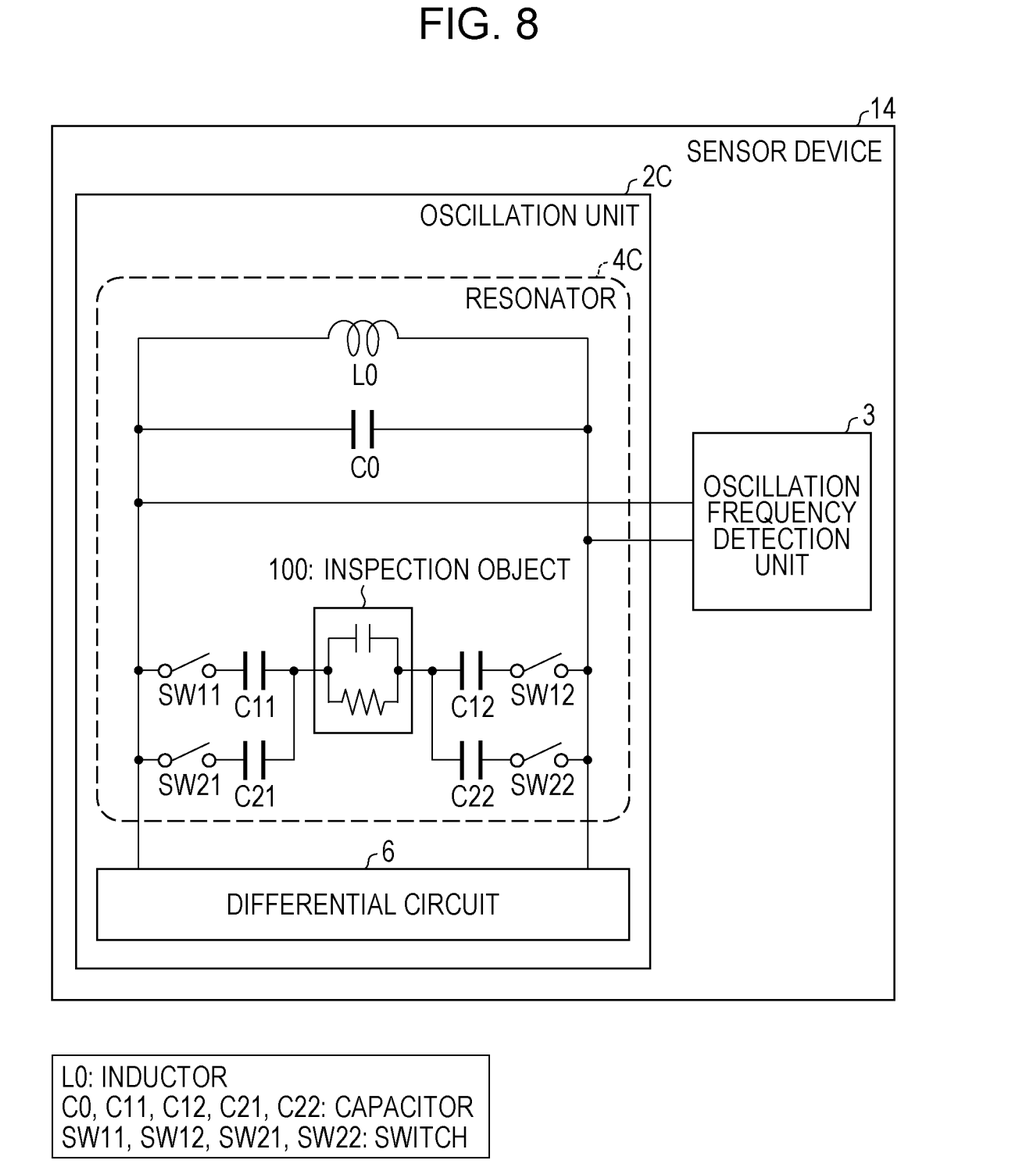
FIG. 8 is a block diagram illustrating a configuration of a sensor device according to Embodiment 4 of the invention.
Figure 9:
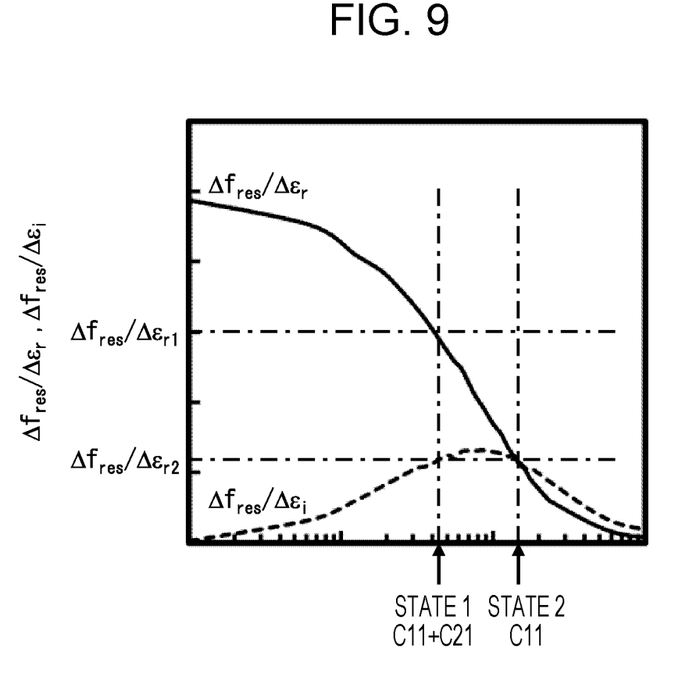
FIG. 9 is a graph illustrating a change rate of an oscillation frequency with respect to a change in a complex dielectric, constant in capacitance values of capacitors connected to an inspection object in series in the sensor device illustrated in FIG. 8.

Embodiment 4 of the invention will be described with reference to FIGS. 8 and 9. FIG. 8 is a block diagram illustrating a configuration of a sensor device 14 according to Embodiment 4. FIG. 9 is a graph indicating a change rate of an oscillation frequency with respect to a change in a complex dielectric constant in capacitance values of capacitors connected to the inspection object 100 in series. Note that, in the present embodiment, components having equivalent functions to those of the components of Embodiment 1 described above will be given the same numbers and description thereof will be omitted.

(Configuration of Sensor Device 14)

As illustrated in FIG. 8, the sensor device 14 includes the oscillation frequency detection unit 3 similarly to the sensor device 11 described above, and includes an oscillation unit 2C instead of the oscillation unit 2 of the sensor device 11.

The oscillation unit 2C has the differential circuit 6 similarly to the oscillation unit 2, but is an LC oscillation circuit that has a resonator 4C instead of the resonator 4 of the oscillation unit 2 and is formed on the integrated circuit board. An oscillation frequency of the oscillation unit 2C is preferably in a vicinity of 100 GHz, in particular, 30 to 200 GHz.

The resonator 4C has the capacitors C0, C11, and C12, and the inductor L0 similarly to the resonator 4 in the oscillation unit 2 described above. The resonator 4C also has capacitors C21 and C22 and switches SW11, SW12, SW21, and SW22 (capacitance value switching unit).

Differently from the capacitors C11 and C12 in the sensor device 11 of Embodiment 1, one end of the capacitor C11 is connected to one end of the inductor L0 and one end of the capacitor C0 through the switch SW11. One end of the capacitor C12 is connected to the other end of the inductor L0 and the other end of the capacitor C0 through the switch SW12. One end of the capacitor C21 is connected to one end of the inductor L0 and one end of the capacitor C0 through the switch SW21, and one end of the capacitor C22 is connected to the other end of the inductor L0 and the other end of the capacitor C0 through the switch SW22. The inspection object 100 contacts the other end of each of the capacitors C21 and C22.

The switches SW11, SW12, SW21, and SW22 are open/close switches by which the capacitors C11, C12, C21, and C22 are connected to or disconnected from the inductor L0 and the capacitor C0. Open and close of the switches SW11, SW12, SW21, and SW22 are controlled by a control circuit (not illustrated) provided in the sensor device 14. There are seven patterns of combinations of open and close of the switches SW11, SW12, SW21, and SW22 as illustrated in Table 1 described below, in Table 1, "1" indicates a closed state (ON) and "0" indicates an opened state (OFF).

TABLE 1

| Pattern | SW11 | SW12 | SW21 | SW22 | Capacitors connected to C0 and L0 |
|---|---|---|---|---|---|
| (1) | 1 | 1 | 0 | 0 | C11, C12 |
| (2) | 1 | 1 | 1 | 0 | C11, C12, C21 |
| (3) | 1 | 1 | 0 | 1 | C11, C12, C22 |
| (4) | 1 | 1 | 1 | 1 | C11, C12, C21, C22 |
| (5) | 0 | 0 | 1 | 1 | C21, C22 |
| (6) | 1 | 0 | 1 | 1 | C11, C21, C22 |
| (7) | 0 | 1 | 1 | 1 | C12, C21, C22 |

(Oscillation Frequency of Oscillation Unit 2C)

The sensor device 14 of the present embodiment is different from the sensor device 11 of Embodiment 1. The difference lies in that the capacitance values of the series capacitors connected to the inspection object 100 in series are switched by the switches SW11, SW12, SW21, and SW22. The oscillation frequency of the oscillation unit 2C changes similarly to the change in the oscillation frequency of the oscillation unit 2 described in Embodiment 1. In the imaginary part of the complex dielectric constant, the change in the oscillation frequency reaches a maximum value when the series capacitors have certain capacitances.

Here, setting of the capacitances of the capacitors will be described with reference to FIG. 9. Note that, for convenience, "C11" and "C21" are respectively treated as the capacitance values of the capacitors C11 and C21. C11 and C11+C21 are set as two points (which correspond to a state 2 and a state; 1 in FIG. 9) at which $\Delta fres/\Delta \varepsilon_i$ has an almost maximum value. The state 1 is obtained by a pattern (1) indicated in Table 1 and the state 2 is obtained by a pattern (2), (4), or (6). Setting is performed in such a manner that $\Delta fres/\Delta \varepsilon_i$ in the state 1 and $\Delta fres/\Delta \varepsilon_i$ in the state 2 have almost the same maximum values. On the other hand, $\Delta fres/\Delta \varepsilon_r$ is $\Delta fres/\Delta \varepsilon_{r1}$ in the state 1 and $\Delta fres/\Delta \varepsilon_r$ is $\Delta fres/\Delta \varepsilon_{r2}$ in the state 2 and different values are obtained in the states 1 and 2. The capacitance values of the capacitors C12 and C22 are also set similarly to those of the capacitors C11 and C21.

Note that, though description has been given here for an example of setting two different capacitance values, the capacitance values that are able to be set are not limited to the two different capacitance values. Though description has been given by taking an example in which $\Delta fres/\Delta \varepsilon_i$ is set to be fixed with respect to the capacitance that is switched, the setting is not limited thereto. Moreover, a plurality of appropriate combinations of $\Delta fres/\Delta \varepsilon_r$ and $\Delta fres/\Delta \varepsilon_i$ may be prepared in accordance with the complex dielectric constant that is desired to be detected and a desired value may be calculated from a plurality of obtained detection values of the changes in the oscillation frequency.

(Operation of Sensor Device 14)

An operation of the sensor device 14 is the same as the operation of the sensor device 11 of Embodiment 1 and a change in the complex dielectric constant of the inspection object 100 near the oscillation unit 2C is detected as a change in the oscillation frequency.

In the resonator 4C, when the switches SW11, SW12, SW21, and SW22 in any of the combinations are closed, the corresponding capacitors C11, C12, C21, and C22 are connected to the capacitor C0 and the inductor L0. On the basis of the capacitance values of the series capacitors obtained through the connection, the resonant frequency changes in accordance with the complex dielectric constant of the inspection object 100.

(Effect of Sensor Device 14)

An effect of the sensor device 14 in Embodiment 4 will be described.

Similarly to the sensor device 11 in Embodiment 1, the sensor device 14 is able to detect a state of the water according to not only the real part of the complex dielectric constant but also the imaginary part of the complex dielectric constant. Thereby, by detecting a change in the imaginary part of the complex dielectric constant of the water when the frequency is in a vicinity of 100 GHz, in particular, 30 to 200 GHz, a hydration state is able to be detected with sufficient sensitivity.

In the sensor device 14, the capacitance values of the series capacitors connected to the inspection object 100 in series are switched by the switches SW11, SW12, SW21, and SW22. This makes it possible to switch the sensitivity for the change in the oscillation frequency with respect to the changes of the real part and the imaginary part of the complex dielectric constant. Therefore, it is possible to detect, for the inspection object 100, the changes of oscillation frequency with respect to two different $\Delta fres/\Delta \varepsilon_r$ ($\Delta fres/\Delta \varepsilon_{r1}$ and $\Delta fres/\Delta \varepsilon_{r2}$) while $\Delta fres/\Delta \varepsilon_i$ is fixed. By taking a difference of the detection of changes in the oscillation frequency with respect to two different $\Delta fres/\Delta \varepsilon_r$, the change in the imaginary part of the complex dielectric constant of the inspection object 100 is offset and only the change in the real part is able to be calculated.

Note that, the aforementioned configuration in which the capacitance values of the series capacitors connected to the inspection object 100 in series are switched by the switches SW11, SW12, SW21, and SW22 is also able to be applied to Embodiments 1 to 3 described above.

[Conclusion]

Each of the sensor devices 11 to 14 according to an aspect 1 of the invention includes an oscillation unit that is formed in a semiconductor integrated circuit, and an oscillation frequency detection unit that detects an oscillation frequency of the oscillation unit, in which the oscillation unit includes a capacitor connected to an inspection object in series and changes the oscillation frequency in accordance with a complex dielectric constant of the inspection object.

According to the aforementioned configuration, the complex dielectric constant of the inspection object 100 containing moisture depends on a state of water that is a main component. Thus, each of the sensor devices 11 to 14 is able to detect the state of the water in the inspection object 100 on the basis of the oscillation frequency of the oscillation unit 2. A change rate of an imaginary part of the complex dielectric constant of the inspection object 100 varies depending on the capacitance values of the capacitors C11 and C12 that are connected to the inspection object 100 in series. By using such a characteristic, a change in the imaginary part of the complex dielectric constant of the inspection object 100 is able to be detected as a change in the oscillation frequency.

In the aspect 1, in each of the sensor devices 11 to 14 according to an aspect 2 of the invention, a capacitance of the capacitor may have a value at which a change rate of the oscillation frequency with respect to a change in an imaginary part of the complex dielectric constant of the inspection object is a maximum value or a value in a vicinity thereof.

According to the aforementioned configuration, a state of water according to the imaginary part of the complex dielectric constant is able to be detected. By detecting a change in the imaginary part of the complex dielectric constant of the water when the frequency is in a vicinity of 100 GHz, in particular, 30 to 200 GHz, a hydration state is able to be detected with sufficient sensitivity.

In the aspect 1 or 2, in the sensor device 12 according to an aspect 3 of the invention, the capacitor may be formed by a surface protection film of the semiconductor integrated circuit.

According to the aforementioned configuration, it is possible to suppress an increase in a size and manufacturing cost of the sensor device 12.

In the aspect 1 or 2, in the sensor device 13 according to an aspect 4 of the invention, the capacitor may be a capacitor element (MIM capacitor MIM1, MIM2) of the semiconductor integrated circuit.

According to the aforementioned configuration, it is possible to suppress an increase in a size and manufacturing cost of the sensor device 13.

In the aspects 1 to 4, in the sensor device 12 according to an aspect 5 of the invention, the oscillation unit may further include a capacitance value switching unit that switches a capacitance value of the capacitor.

According to the aforementioned configuration, it is possible to switch the sensitivity for the change in the oscillation frequency with respect to the changes of the real part and the imaginary part of the complex dielectric constant.

[Supplementary Note]

The invention is not limited to each of the embodiments described above, and may be modified in various manners within the scope indicated in the claims and an embodiment achieved by appropriately combining technical means disclosed in each of different embodiments is also encompassed in the technical scope of the invention. Further, by combining the technical means disclosed in each of the embodiments, a new technical feature may be formed.

REFERENCE SIGNS LIST 2, 2A, 2B, 2C oscillation unit
3 oscillation frequency detection unit
8 surface protection film
11 to 14 sensor device
100 inspection object
C11, C12, C21, C22 capacitor
MIM1, MIM2 MIM capacitor (capacitor element)
SW11, SW12, SW21, SW22 switch (capacitance value switching unit)

The invention claimed is:

1. A sensor device comprising:
an oscillation unit that is formed in a semiconductor integrated circuit; and
an oscillation frequency detection unit that detects an oscillation frequency of the oscillation unit, wherein
the oscillation unit includes a capacitor connected to an inspection object in series and to detect changes in a complex dielectric constant of the inspection object by detecting the oscillation frequency in accordance with the complex dielectric constant of the inspection object and measure the complex dielectric constant of the inspection object by the oscillation frequency detection unit, and
a capacitance value of the capacitor has a value at which a change rate of the oscillation frequency with respect to a change in an imaginary part of the complex dielectric constant of the inspection object is a maximum value or a value in a vicinity of the maximum value, and
a switching means that sets the maximum value or a value in a vicinity of the maximum value.

2. The sensor device according to claim 1, wherein the capacitor is formed by a surface protection film of the semiconductor integrated circuit.

3. The sensor device according to claim 1, wherein the capacitor is a capacitor element of the semiconductor integrated circuit.

4. The sensor device according to claim 1, wherein the switching means switches the capacitance value of the capacitor connected to the inspection object in series by a switch.

* * * * *